United States Patent [19]
Sakuragi

[11] Patent Number: 5,959,473
[45] Date of Patent: Sep. 28, 1999

[54] TRANSISTOR OUTPUT CIRCUIT

[75] Inventor: Takamasa Sakuragi, Hiratsuka, Japan

[73] Assignee: Canon Kabushiki Kaisha, Tokyo, Japan

[21] Appl. No.: 08/783,670

[22] Filed: Jan. 15, 1997

[30] Foreign Application Priority Data

Jan. 19, 1996 [JP] Japan .................................. 8-007323

[51] Int. Cl.⁶ .............................................. H03K 19/003
[52] U.S. Cl. ........................... 327/111; 327/108; 327/112; 327/389; 326/33; 326/27; 326/87
[58] Field of Search ...................... 327/389, 434, 327/110, 108, 391, 380, 111, 112; 326/31, 33, 34, 30, 87, 27

[56] References Cited

U.S. PATENT DOCUMENTS

| | | | |
|---|---|---|---|
| 4,714,844 | 12/1987 | Muto | 327/350 |
| 4,716,305 | 12/1987 | Sakuragi et al. | 307/296 |
| 4,853,530 | 8/1989 | Muto | 250/214 A |
| 5,045,943 | 9/1991 | Kurihara | 327/50 |
| 5,168,176 | 12/1992 | Wanlass | 326/33 |

*Primary Examiner*—Dinh Le
*Attorney, Agent, or Firm*—Fitzpatrick, Cella, Harper & Scinto

[57] ABSTRACT

A transistor output circuit comprises a first insulated gate transistor having a control electrode connected to an input terminal, one main electrode connected to a first diode, and the other main electrode connected to a reference voltage source, and a second insulated gate transistor having a control electrode connected to the input terminal, one main electrode connected to an output terminal, and the other main electrode connected to the reference voltage source. A ratio ($W_1/L_1$) of a gate width ($W_1$) to a gate length ($L_1$) of the first insulated gate transistor is larger than a ratio ($W_2/L_2$) of a gate width ($W_2$) to a gate length ($L_2$) of the second insulated gate transistor.

11 Claims, 3 Drawing Sheets

5,959,473

TRANSISTOR OUTPUT CIRCUIT

BACKGROUND OF THE INVENTION

1. Field of the Invention

The present invention relates to a transistor output circuit using an insulated gate transistor and, more particularly, to a transistor output circuit which prevents the oscillation (to be referred to as ringing hereinafter) of an output signal.

2. Related Background Art

FIG. 4 is a circuit diagram showing a prior art CMOS output circuit. Referring to FIG. 4, the CMOS output circuit includes a P-channel MOS transistor (to be referred to as a PMOS transistor hereinafter) M1, and an N-channel MOS transistor (to be referred to as an NMOS transistor hereinafter) M2. The source electrode, the drain electrode, and the gate electrode of the NMOS transistor M2 are connected to a GND terminal 2, an output terminal 4, and an input terminal 3, respectively. The source electrode, the drain electrode, and the gate electrode of the PMOS transistor M1 are connected to a power supply 1, the output terminal 4, and the input terminal 3, respectively. Upon application of a logic level to the input terminal 3, the inverted logic level is output from the output terminal 4.

In recent years, a strong demand for driving a large capacitive load with a high-speed signal such as a video signal has arisen. To drive a large capacitive load by a CMOS output circuit, the output impedance of the CMOS output circuit must be lowered. For this purpose, the ratio (W/L) of the gate width (W) to the gate length (L) of each of the PMOS and NMOS transistors M1 and M2 must be increased.

However, because of the parasitic inductance in the line from the output terminal to the capacitive load of the CMOS output circuit, or the power supply line of the CMOS output circuit, a closed circuit consisting of L, C, and R is equivalently formed, as shown in FIG. 5 (R equivalently represents the output impedance of the CMOS output circuit, L equivalently represents the inductance of the power supply ($V_{DD}$) line or the line from the output terminal to the capacitive load, and C represents the capacitive load). For this reason, the output voltage waveform which appears in the capacitive load oscillates at a frequency f given by equation (1) below. Since Q of the oscillation is inversely proportional to R, the oscillation is harder to attenuate as the output impedance of the CMOS output circuit is lowered:

$$f = \frac{1}{2\pi\sqrt{(L \cdot C)}} \tag{1}$$

In a system for processing information at a high speed, if this ringing becomes large, information (voltage) may be erroneously transmitted, and additionally, unnecessary radiation caused by radio waves may increase.

When the capacitive load is to be driven at a high speed by the prior art CMOS output circuit, large ringing inevitably occurs, as described above.

SUMMARY OF THE INVENTION

It is an object of the present invention to provide a CMOS output circuit which drives a capacitive load at a high speed and simultaneously minimizes ringing.

In order to achieve the above object, according to the present invention, there is provided a transistor output circuit comprising:

a first insulated gate transistor having a control electrode connected to an input terminal, one main electrode connected to an anode of a first diode, and the other main electrode connected to a reference voltage source; and a second insulated gate transistor having a control electrode connected to the input terminal, one main electrode connected to an output terminal, and the other main electrode connected to the reference voltage source, wherein a ratio ($W_1/L_1$) of a gate width ($W_1$) to a gate length ($L_1$) of the first insulated gate transistor is larger than a ratio ($W_2/L_2$) of a gate width ($W_2$) to a gate length ($L_2$) of the second insulated gate transistor.

DETAILED DESCRIPTION OF THE PREFERRED EMBODIMENTS

Figure 1:
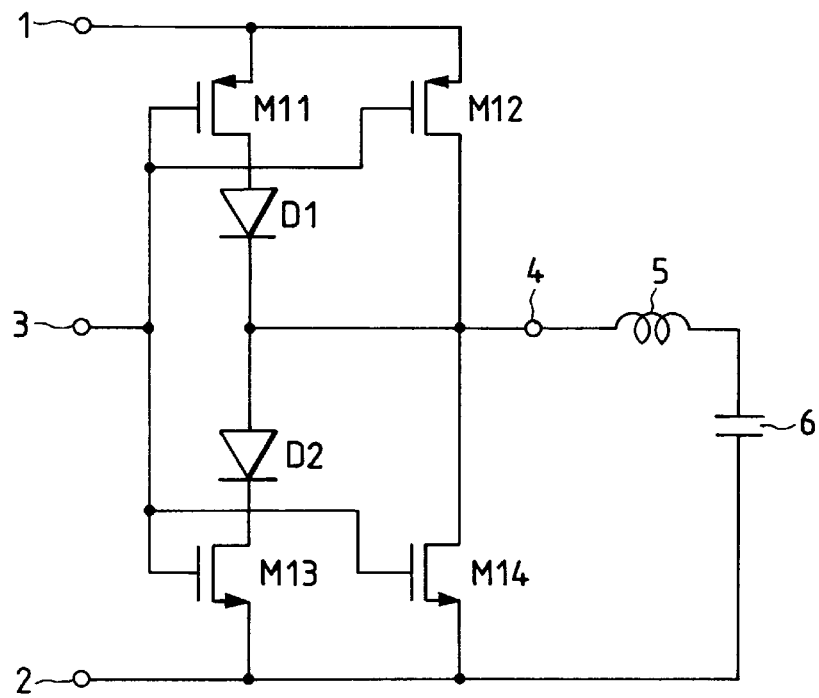
FIG. 1 is a circuit diagram showing a CMOS output circuit according to the first embodiment of the present invention and a load therein.

In the present application, a control electrode means the gate of an insulated gate transistor, and a main electrode means the source or drain of the insulated gate transistor.

The function of the present invention will be described first. In the following description, a MOS transistor is used as an insulated gate transistor.

In the present invention, when the output terminal level changes from the first level ("L" level) to the second level ("H" level), the first and second MOS transistors are turned on to flow a current to a capacitance as a load, thereby charging it. The ratio ($W_1/L_1$) of the gate width to the gate length of the first MOS transistor is larger than the ratio ($W_2/L_2$) of the gate width to the gate length of the second MOS transistor. In addition, the ON resistance of a MOS transistor is proportional to W/L, as represented by equation (2) below. Therefore, the capacitive load is charged at a high speed by the first MOS transistor having a large W/L value:

$$R_{ON}=k(W/L)(V_{GS}-V_t) \tag{2}$$

where k is a constant, and $V_{GS}$ is the gate-source voltage of the MOS transistor.

When charging continues, and the output terminal level reaches a certain value, the drain-source voltage (to be referred to as a voltage $V_{DS}$ hereinafter) of the first MOS transistor is made close to zero by a diode which is series-connected to the first MOS transistor. Accordingly, the drain current decreases and finally becomes zero. On the other hand, the second MOS transistor is still in the ON state so that the subsequent charging is performed by the second MOS transistor. In the second MOS transistor, the ratio ($W_2/L_2$) of the gate width to the gate length is smaller than $W_1/L_1$, the ON resistance is large, and Q by a parasitic inductance in the capacitive load connected to the output terminal or the connection line between the capacitive load and the output terminal becomes small, so ringing hardly occurs.

To the contrary, when the output terminal level changes from the second level to the first level, the third and fourth MOS transistors are turned on to flow a current from the capacitance as a load, thereby performing a discharge operation. The ratio ($W_3/L_3$) of the gate width to the gate length of the third MOS transistor is larger than the ratio ($W_4/L_4$) of the gate width to the gate length of the fourth MOS transistor. In addition, the ON resistance of a MOS transistor is proportional to W/L, as described above Therefore, the capacitive load is quickly discharged by the third MOS transistor having a large W/L value. When discharging continues, and the output terminal level reaches a certain value, the voltage $V_{DS}$ of the third MOS transistor is made close to zero by a diode which is series-connected to the third MOS transistor. Accordingly, the drain current decreases and finally becomes zero. On the other hand, the fourth MOS transistor is still in the ON state so that the subsequent discharging is performed by the fourth MOS transistor. In the fourth MOS transistor, the ratio ($W_4/L_4$) of the gate width to the gate length is smaller than $W_3/L_3$, the ON resistance is large, and Q by the parasitic inductance in the capacitive load connected to the output terminal or the connection line between the capacitive load and the output terminal becomes small, so ringing hardly occurs.

The embodiments of the present invention will be described below.

FIG. 1 is a circuit diagram that best shows the characteristic features of the present invention. Referring to FIG. 1, the CMOS output circuit includes a power supply terminal 1, a GND terminal 2, an input terminal 3, an output terminal 4, and PMOS transistors M11 and M12. The ratio (W/L) of the gate width (W) to the gate length (L) of the PMOS transistor M11 is larger than that of the PMOS transistor M12. The CMOS output circuit also includes NMOS transistors M13 and M14. The ratio (W/L) of the gate width (W) to the gate length (L) of the NMOS transistor M13 is larger than that of the NMOS transistor M14. A parasitic inductance 5 is present in the line from the output terminal 4 to a capacitive load 6. When the input terminal is at "L", the PMOS transistors M11 and M12 are in the ON state while the NMOS transistors M13 and M14 are in the OFF state, and the output terminal is at "H". When the input terminal goes "H", the PMOS transistors M11 and M12 are turned off, and the NMOS transistors M13 and M14 are turned on. The capacitive load 6 is discharged by the NMOS transistors M13 and M14, and the output terminal level drops. The ratio (W/L) of the gate width (W) to the gate length (L) of the NMOS transistor M13 is set to be larger than that of the NMOS transistor M14. The ON resistance of a MOS transistor is represented by the reciprocal of $g_m$ (mutual conductance), and gm in a saturated state is represented by the following equation:

$$g_m = \frac{dI_D}{dV_{GS}} = k'\frac{W}{L}(V_{GS} - V_t) \quad (3)$$

$k' = \mu_n C_{ox}$ where $\mu_n$ is the average mobility of electrons in the channel, $C_{OX}$ is the gate oxide film capacitance, $V_{GS}$ is the gate-source voltage, $V_t$ is the threshold voltage.

As is apparent from equation (3), $g_m$ is proportional to W/L. Therefore, the ON resistance decreases as W/L increases. When the NMOS transistors M13 and M14 are simultaneously turned on to discharge the capacitive load, the discharge current is mainly supplied by the NMOS transistor M13 because the ON resistance of the NMOS transistor M13 having a large value W/L is smaller than that of the NMOS transistor M14.

When the output terminal level drops to the anode-cathode forward voltage (to be referred to as a voltage VF hereinafter; about 0.7 V) of a diode D2, the drain-source voltage (to be referred to as a voltage VDS hereinafter) of the NMOS transistor M13 almost becomes zero, so that the NMOS transistor M13 is turned off.

At this time, the NMOS transistor M14 is kept in the ON state because the voltage $V_{DS}$ of the NMOS transistor M14 is held at about 0.7 V.

Therefore, at output terminal levels lower than VF discharging is performed by the NMOS transistor M14. Since W/L of the NMOS transistor M14 is set to be small, its ON resistance is large, and discharging takes place slowly. At this time, because of the large ON resistance of the NMOS transistor M14, Q of the resonance caused by the parasitic inductance 5 in the line and the capacitive load 6 is lowered. For this reason, ringing hardly occurs, and the attenuation of the ringing is slow. To increase the falling rate of the output terminal level, W/L of the NMOS transistor M13 may be increased.

Figure 6:
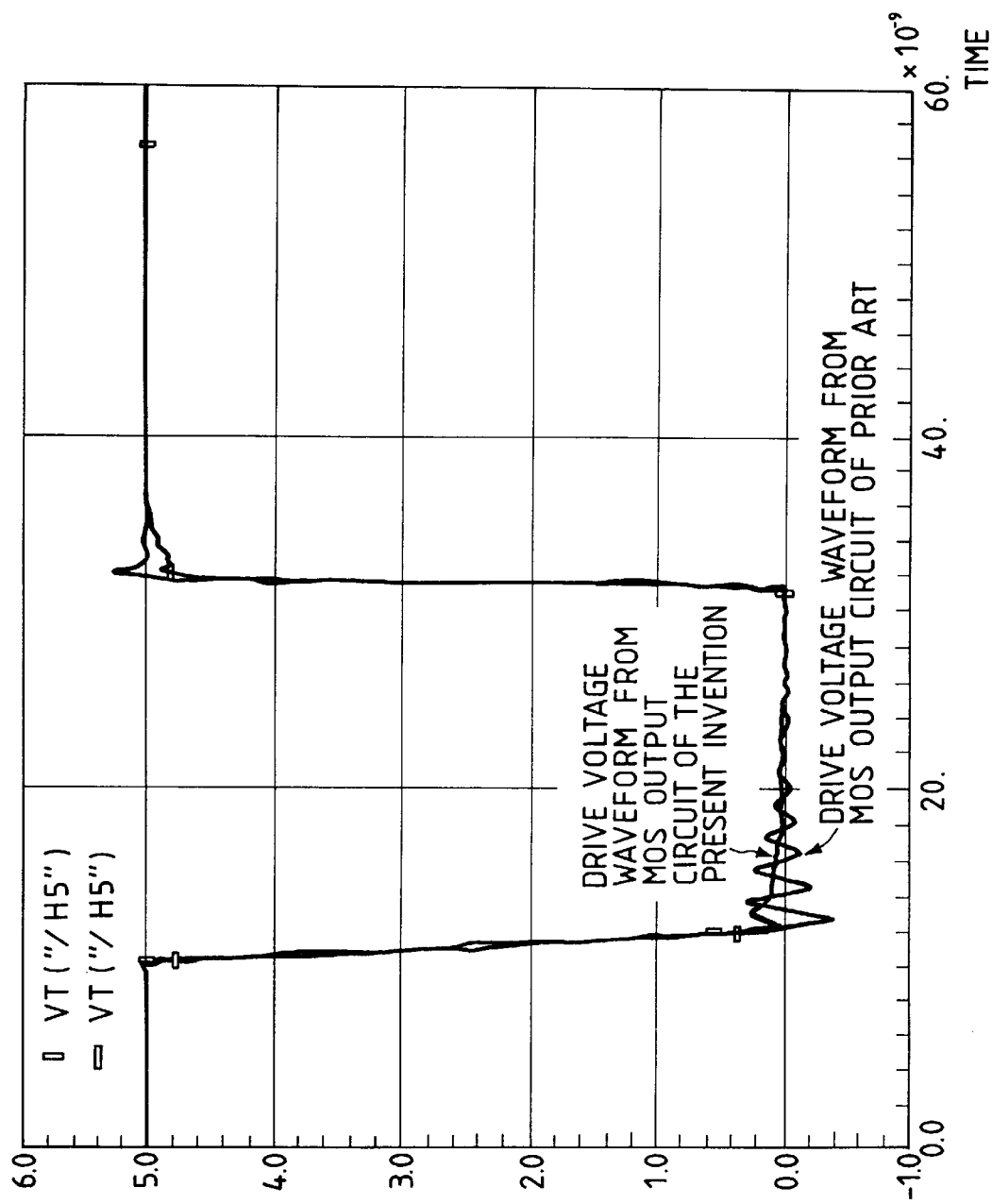
FIG. 6 is a chart showing the drive voltage waveform of a capacitive load in the prior art CMOS output circuit and the drive voltage waveform of a capacitive load in the CMOS circuit according to the present invention.

This also applies to a case in which the input terminal level changes from "H" to "L", the NMOS transistors M13 and M14 are turned off while the PMOS transistors M11 and M12 are turned on, and the output terminal level changes from "L" to "H". Until the output terminal level reaches (power supply voltage—$V_F$), the capacitive load is rapidly charged by the PMOS transistor M11 having a large value W/L. When the output terminal level reaches (power supply voltage—$V_F$), the voltage $V_{DS}$ of the PMOS transistor M11 almost becomes zero and the PMOS transistor M11 is turned off. The subsequent charging for the capacitive load is slowly performed by the PMOS transistor M12 having a large ON resistance. In this case as well, Q of the resonant circuit is low, so ringing hardly occurs. FIG. 6 is a chart showing the difference in output waveform between the prior art circuit and the output circuit of the present invention by SPICE simulations.

Figure 2:
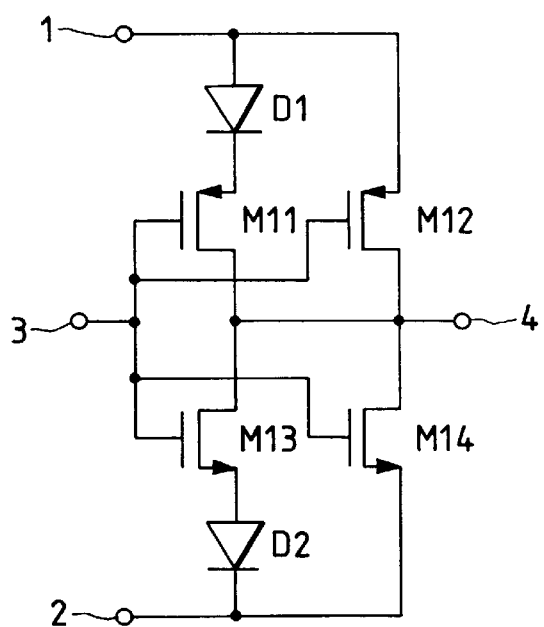
FIG. 2 is a circuit diagram showing a CMOS output circuit according to the second embodiment of the present invention.
Figure 3:
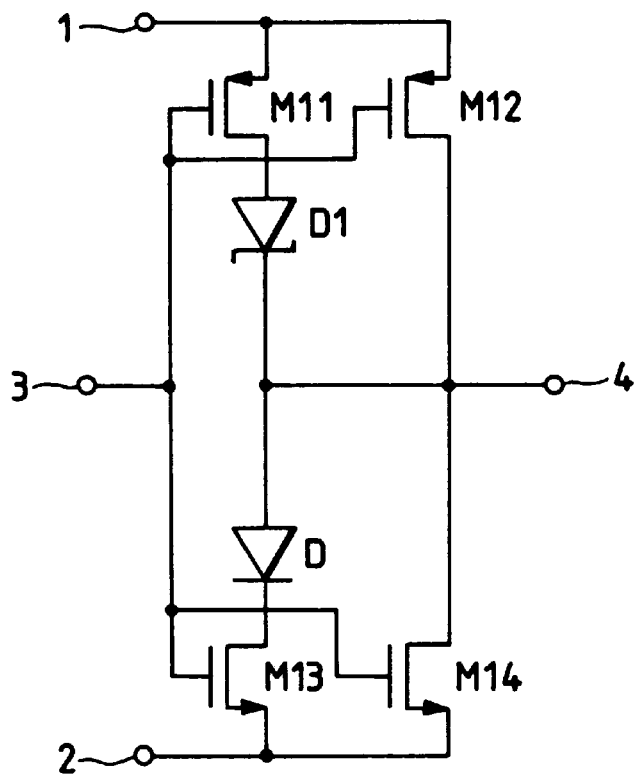
FIG. 3 is a circuit diagram showing a CMOS output circuit according to the third embodiment in which Schottky diodes are used.
Figure 4:
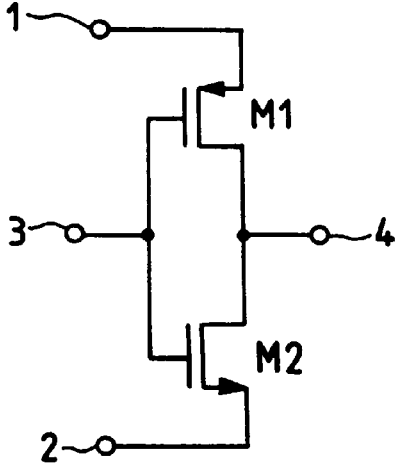
FIG. 4 is a circuit diagram showing a prior art CMOS output circuit.
Figure 5:
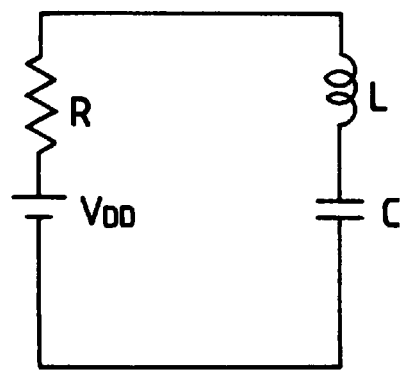
FIG. 5 is an equivalent circuit diagram for explaining a load in the CMOS circuit.

According to other embodiments of the present invention, diodes D1 and D2 may be connected to the sources of a PMOS transistor M11 and an NMOS transistor M13, respectively, as shown in FIG. 2. Alternatively, as shown in FIG. 3, a Schottky diode may be used.

As has been described above, according to the present invention, when the capacitive load is to be driven by a transistor output circuit, a high-speed operation and ringing prevention can be simultaneously achieved.

What is claimed is:

1. A transistor output circuit comprising:
   a first insulated gate transistor having a control electrode connected to an input terminal, one main electrode connected to a first end of a first diode, and the other main electrode connected to a first reference voltage source;
   a second insulated gate transistor having a control electrode connected to said input terminal, one main electrode connected to an output terminal, and the other main electrode connected to said first reference voltage source, wherein a ratio ($W_1/L_1$) of a gate width ($W_1$) to a gate length ($L_1$) of said first insulated gate transistor is larger than a ratio ($W_2/L_2$) of a gate width ($W_2$) to a gate length ($L_2$) of said second insulated gate transistor;

a third insulated gate transistor having a control electrode connected to said input terminal, one main electrode connected to a first end of a second diode, having a second end coupled to a second end of said first diode and to said output terminal, and the other main electrode connected to a second reference voltage source which is different from said reference voltage source; and a fourth insulated gate transistor having a control electrode connected to said input terminal, one main electrode connected to said output terminal, and the other main electrode connected to said second reference voltage source, wherein a ratio ($W_3/L_3$) of a gate width ($W_3$) to a gate length ($L_3$) of said third insulated gate transistor is larger than a ratio ($W_4/L_4$) of a gate width ($W_4$) to a gate length ($L_4$) of said fourth insulated gate transistor.

2. The circuit according to claim 1, wherein said first and second insulated gate transistors are transistors of the same conductivity type.

3. The circuit according to claim 1, wherein said first end of said first diode is an anode of said first diode.

4. The circuit according to claim 1, wherein said first end of said second diode is a cathode of said second diode.

5. The circuit according to claim 1, wherein said third and fourth insulated gate transistors are transistors of the same conductivity type.

6. The circuit according to claim 1, wherein said first and third insulated gate transistors are transistors of different conductivity type.

7. The circuit according to any one of claims 1, 5, and 6, wherein said second and fourth insulated gate transistors are transistors of different conductivity type.

8. A transistor output circuit comprising:

a first insulated gate transistor of a first conductivity type, which has a control electrode connected to an input terminal, one main electrode connected to an anode of a first diode, and the other main electrode connected to a first power supply;

a second insulated gate transistor of the first conductivity type, which has a control electrode connected to said input terminal, one main electrode connected to an output terminal, and the other main electrode connected to said first power supply;

a third insulated gate transistor of a second conductivity type, which has a control electrode connected to said input terminal, one main electrode connected to a cathode of a second diode, and the other main electrode connected to a second power supply having a voltage lower than that of said first power supply; and a fourth insulated gate transistor of the second conductivity type, which has a control electrode connected to said input terminal, one main electrode connected to said output terminal, and the other main electrode connected to said second power supply, wherein a cathode of said first diode and an anode of said second diode are connected to said output terminal, a ratio ($W_1/L_1$) of a gate width ($W_1$) to a gate length ($L_1$) of said first insulated gate transistor is larger than a ratio ($W_2/L_2$) of a gate width ($W_2$) to a gate length ($L_2$) of said second insulated gate transistor, and a ratio ($W_3/L_3$) of a gate width ($W_3$) to a gate length ($L_3$) of said third insulated gate transistor is larger than a ratio ($W_4/L_4$) of a gate width ($W_4$) to a gate length ($L_4$) of said fourth insulated gate transistor.

9. A transistor output circuit comprising:

a first insulated gate transistor of a first conductivity type, which has a control electrode connected to an input terminal, one main electrode connected to an output terminal, and the other main electrode connected to a cathode of a first diode;

a second insulated gate transistor of the first conductivity type, which has a control electrode connected to said input terminal, one main electrode connected to said output terminal, and the other main electrode connected to a first power supply;

a third insulated gate transistor of a second conductivity type, which has a control electrode connected to said input terminal, one main electrode connected to said output terminal, and the other main electrode connected to an anode of a second diode; and a fourth insulated gate transistor of the second conductivity type, which has a control electrode connected to said input terminal, one main electrode connected to said output terminal, and the other main electrode connected to a second power supply having a voltage lower than that of said first power supply, wherein an anode of said first diode is connected to said first power supply, a cathode of said second diode is connected to said second power supply, a ratio ($W_1/L_1$) of a gate width ($W_1$) to a gate length ($L_1$) of said first insulated gate transistor is larger than a ratio ($W_2/L_2$) of a gate width ($W_2$) to a gate length ($L_2$) of said second insulated gate transistor, and a ratio ($W_3/L_3$) of a gate width ($W_3$) to a gate length ($L_3$) of said third insulated gate transistor is larger than a ratio ($W_4/L_4$) of a gate width ($W_4$) to a gate length ($L_4$) of said fourth insulated gate transistor.

10. A transistor output circuit comprising:

a first circuit comprising a serial connection of a first insulated gate transistor of a first conductivity type and a first diode;

a second insulated gate transistor connected in parallel with to said first circuit;

a second circuit comprising a serial connection of a third insulated gate transistor of a second conductivity type and a second diode; and a fourth insulated gate transistor of the second conductivity type connected in parallel to said second circuit, wherein said first circuit is coupled to said second circuit at a node, and said first circuit and said second circuit are connected serially between a first reference voltage source and a second reference voltage source, wherein said second and fourth insulated gate transistors are connected serially between said first reference voltage source and said second reference voltage source, wherein gates of each of said first, second, third and fourth insulated gate transistors is connected to an input terminal, wherein said node is connected to an output terminal, wherein a ratio ($W_1/L_1$) of a gate width ($W_1$) to a gate length ($L_1$) of said first insulated gate transistor is larger than a ratio ($W_2/L_2$) of a gate width ($W_2$) to a gate length ($L_1$) of said second insulated gate transistor, and wherein a ratio ($W_3/L_3$) of a gate width ($W_3$) to a gate length ($L_3$) of said third insulated gate transistor is larger than a ratio ($W_4/L_4$) of a gate width ($W_4$) to a gate length ($L_4$) of said fourth insulated gate transistor.

11. The circuit according to claim 8 or 10, wherein said first and second diodes are Schottky diodes.

* * * * *

UNITED STATES PATENT AND TRADEMARK OFFICE
CERTIFICATE OF CORRECTION

PATENT NO. : 5,959,473
DATED : September 28, 1999
INVENTOR(S) : TAKAMASA SAKURAGI It is certified that error appears in the above-identified patent and that said Letters Patent is hereby corrected as shown below:

COLUMN 2

Line 60, "$V_{OS}$" should read --$V_{GS}$--.

COLUMN 3

Line 17, "above" should read --above.--; and
    Line 51, "goes "H"," should read --goes to "H,"--.

COLUMN 4

Line 15, "VDS" should read --$V_{DS}$--; and
    Line 21, "VF" should read --$V_{F}$--.

COLUMN 5

Line 14, "said" should read --said first--.

UNITED STATES PATENT AND TRADEMARK OFFICE
CERTIFICATE OF CORRECTION

PATENT NO. : 5,959,473

DATED : September 28, 1999

INVENTOR(S) : TAKAMASA SAKURAGI

It is certified that error appears in the above-identified patent and that said Letters Patent is hereby corrected as shown below:

COLUMN 6

Line 45, "with to" should read --with--.

Signed and Sealed this

Twenty-fifth Day of July, 2000

Attest:

Q. TODD DICKINSON

Attesting Officer

Director of Patents and Trademarks